(12) United States Patent
Nelson et al.

(10) Patent No.: US 6,800,256 B2
(45) Date of Patent: Oct. 5, 2004

(54) SCALEABLE INTER-DIGITIZED TINE NON-THERMAL PLASMA REACTOR

(75) Inventors: David Emil Nelson, Independence Township, MI (US); Mark David Hemingway, Columbiaville, MI (US); Thomas W. Silvis, Flushing, MI (US); Bob Xiaobin Li, Grand Blanc, MI (US)

(73) Assignee: Delphi Technologies, Inc., Troy, MI (US)

( * ) Notice: Subject to any disclaimer, the term of this patent is extended or adjusted under 35 U.S.C. 154(b) by 806 days.

(21) Appl. No.: 09/740,572

(22) Filed: Dec. 18, 2000

(65) Prior Publication Data

US 2002/0076363 A1 Jun. 20, 2002

(51) Int. Cl.$^7$ ................................. F01N 3/10
(52) U.S. Cl. .................. 422/174; 422/186.04
(58) Field of Search ................. 422/174, 186.04, 422/168, 186; 204/164, 177; 60/275

(56) References Cited

U.S. PATENT DOCUMENTS

| | | | |
|---|---|---|---|
| 5,753,087 A | * | 5/1998 | Wang et al. ............... 204/164 |
| 6,338,827 B1 | | 1/2002 | Nelson et al. |
| 6,354,903 B1 | | 3/2002 | Nelson |
| 6,368,451 B1 | | 4/2002 | Goulette et al. |
| 6,423,190 B2 | | 7/2002 | Hemingway et al. |
| 6,464,945 B1 | | 10/2002 | Hemingway |
| 6,482,368 B2 | | 11/2002 | Hemingway et al. |
| 6,537,507 B2 | | 3/2003 | Nelson et al. |
| 6,638,484 B2 | | 10/2003 | Nelson et al. |
| 2002/0131917 A1 | * | 9/2002 | Nejezchleb et al. ... 422/186.04 |

* cited by examiner

Primary Examiner—M. Alexandra Elve
(74) Attorney, Agent, or Firm—Paul L. Marshall

(57) ABSTRACT

A scaleable inter-digitized tine non-thermal plasma reactor element includes at least one pair of inter-digitized tine end connectors connected together defining gas passages between the tines. The prepared inter-digitized tine reactor element has a scaleable height, width, and length. Connectors are defined that enable efficient non-thermal reactor element fabrication for widely varying applications having various flow throughput and constituent reduction requirements. An inter-digitized tine reactor element is provided having several zones that are selectively powered so that the effective length of the reactor can be adjusted during operation for optimal efficiency over a range of operating conditions Structural carrier connectors and structural conductor connectors are provided. Structural carrier connectors have tines defined in a side to side basis comprising a high-k dielectric layer, electrode layer, structural dielectric, electrode layer, and high-k dielectric layer. Structural conductor connectors have tines defined in a side to side basis comprising a high-k dielectric layer, structural conductor, and high-k dielectric layer.

The scaleable reactors include double, single or null dielectric barrier inter-digitized tine non-thermal plasma reactors. The double dielectric barrier reactor has plasma cells bounded by a dielectric barrier in the plasma direction. The single dielectric barrier reactor has plasma cells bounded by a dielectric barrier on one side and by an electrode on the opposite side, in the plasma direction. The null dielectric barrier reactor has plasma cells bounded by electrodes on each side, in the plasma direction.

25 Claims, 8 Drawing Sheets

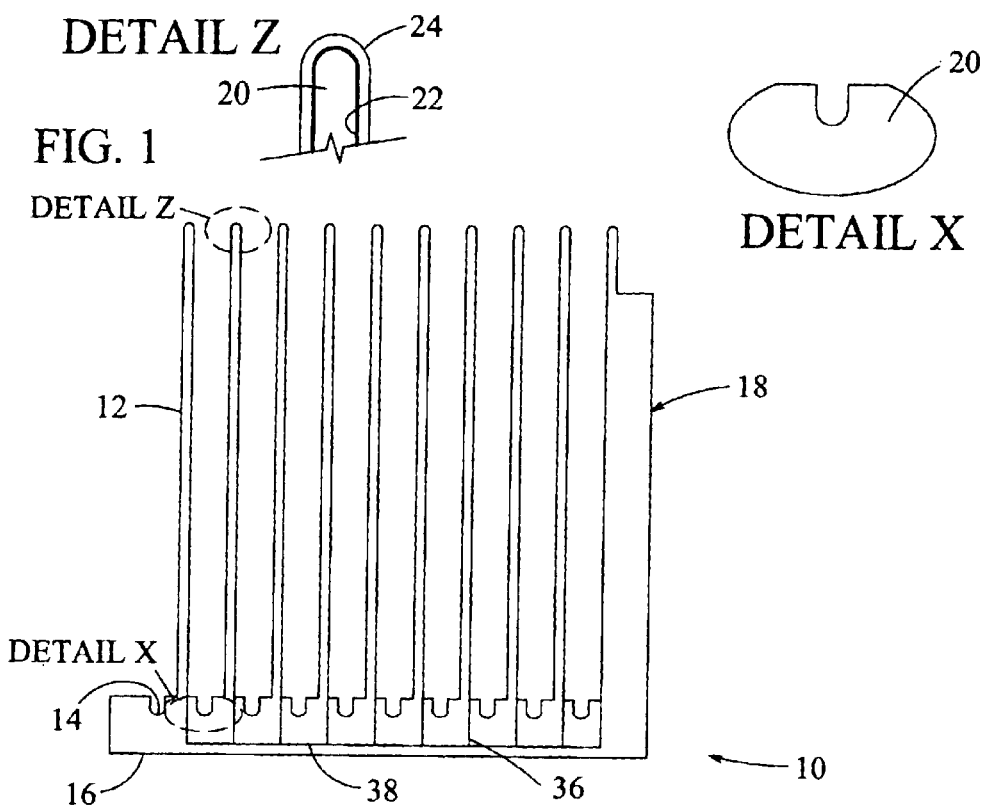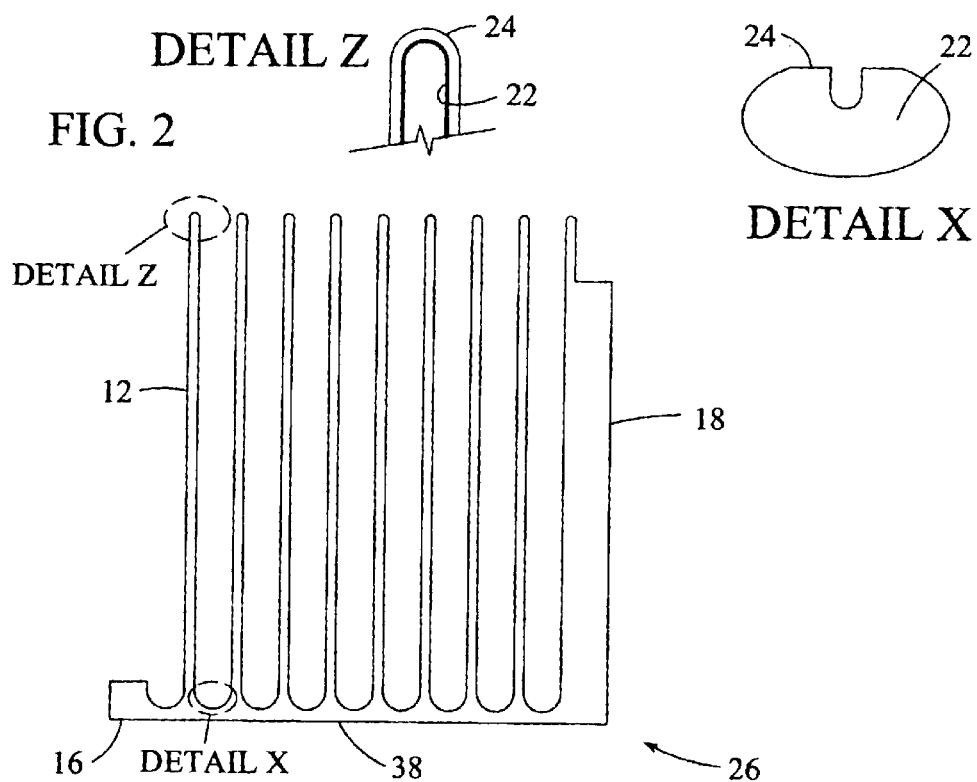

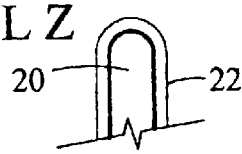
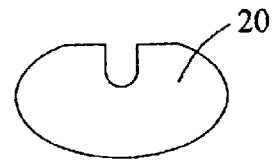
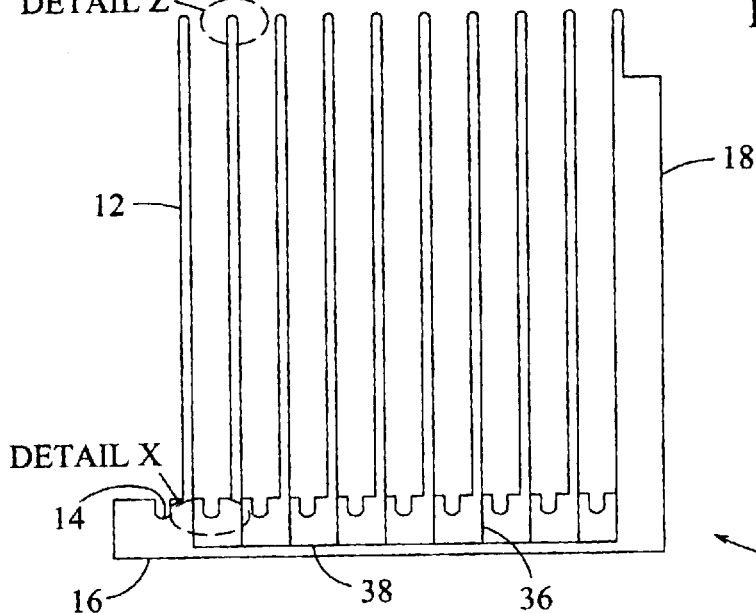
FIG. 3
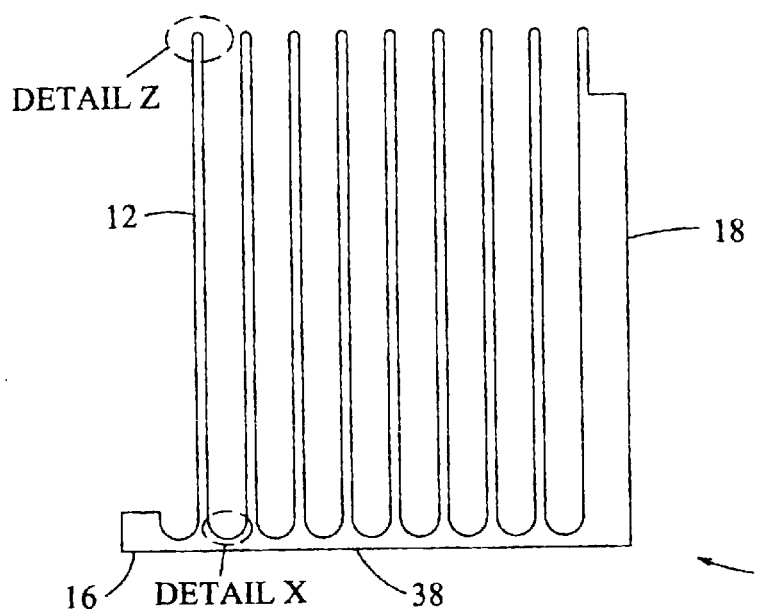
FIG. 4

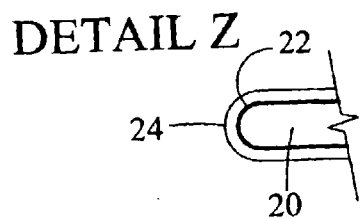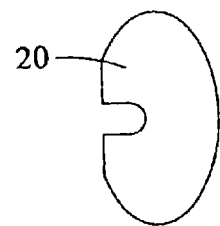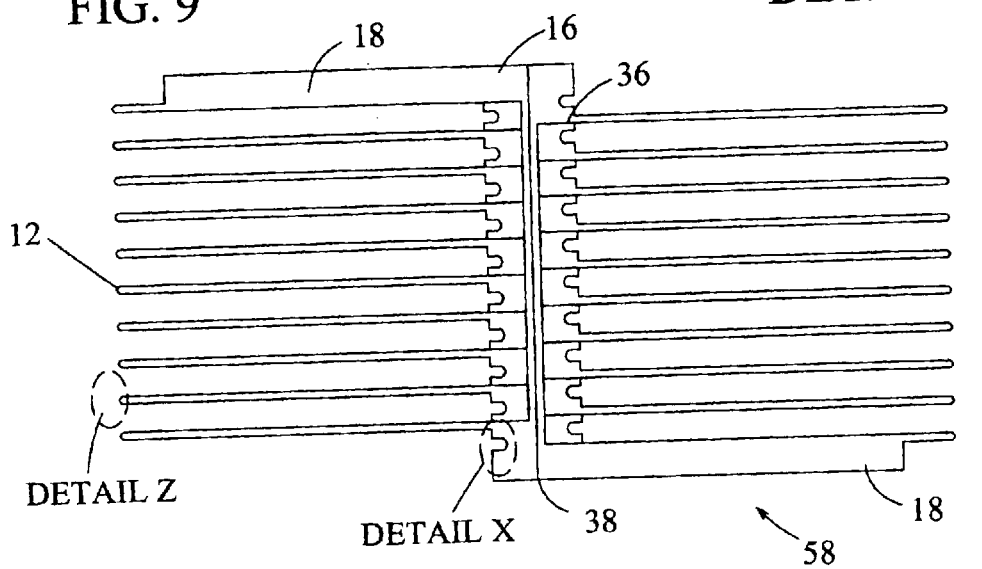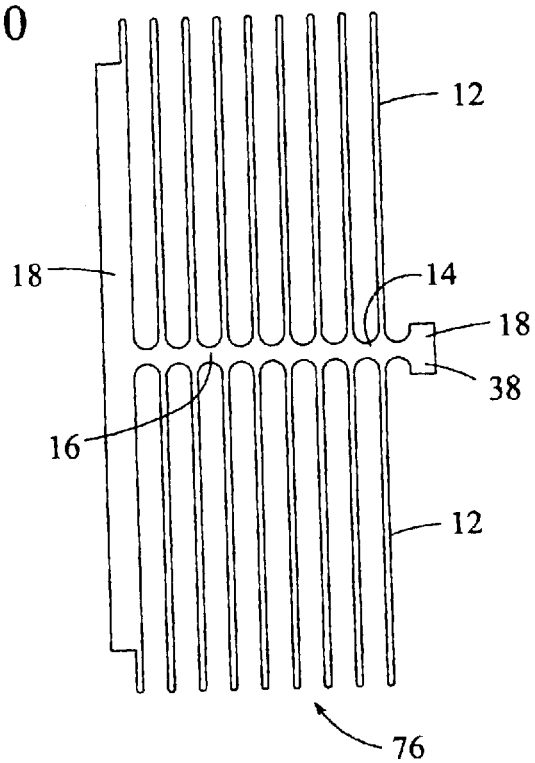

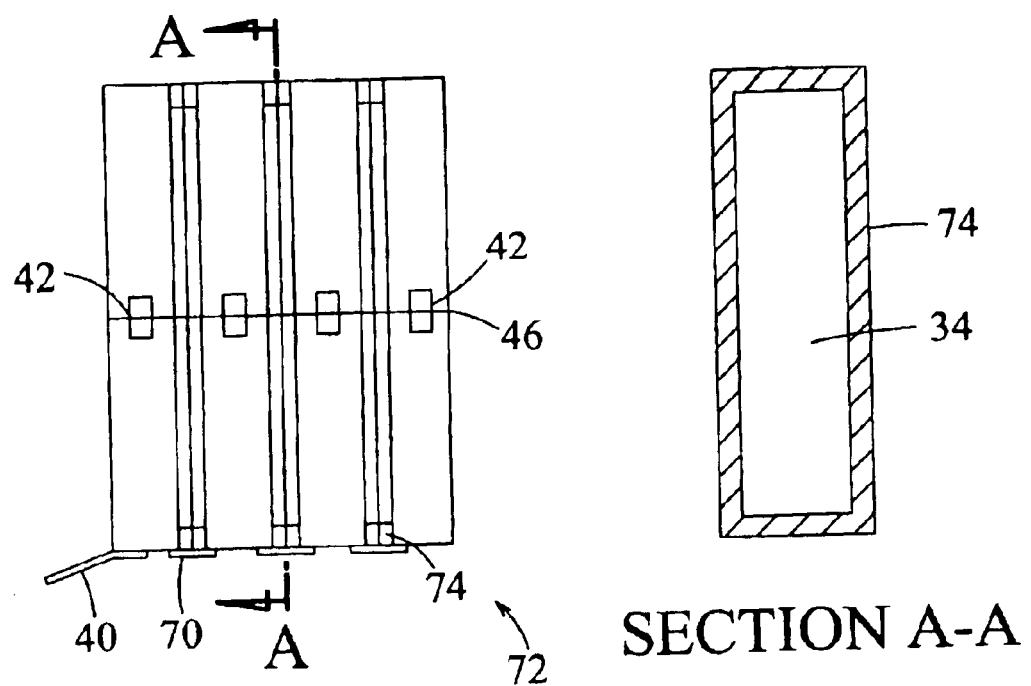

SCALEABLE INTER-DIGITIZED TINE NON-THERMAL PLASMA REACTOR

TECHNICAL FIELD

The present invention relates to non-thermal plasma reactors and more particularly relates to scaleable inter-digitized tine non-thermal plasma reactors.

BACKGROUND OF THE INVENTION

In recent years, non-thermal plasma generated in a packed bed reactor has been shown to be effective in reducing nitric oxides (NOx) produced by power plants and standby generators. These units usually have a reducing agent, such as urea, to enhance the conversion efficiency. The packed bed reactor consists essentially of a high voltage center electrode inserted into a cylinder of dielectric material, usually a form of glass or quartz. An outside or ground electrode is formed by a coating of metal in various forms, including tape, flame spray, mesh, etc. The space between the center electrode and the inside diameter of the dielectric tube is filled or packed with small diameter glass beads. When high voltage alternating current is applied to the center electrode, the surface of the beads go into corona, producing a highly reactive and selective surface for inducing the desired reaction in the gas.

Unfortunately, the packed bed design with its loose beads and glass dielectric is impractical for use in the conditions found in a mobile emitter, such as a car or truck. The vibration and wide temperature swings of the vehicle system would damage the packed bed and the necessary temperature and vibration isolation required to make it survive would not be cost effective.

Cylindrical or planar non-thermal plasma reactors are two common configurations for dielectric barrier discharge type reactors. Both of these configurations are characterized by the presence of one or more insulating layers in a current path between two metal electrodes, in addition to the discharge space.

One such reactor suitable for use with diesel engines and other engines operating with lean air fuel mixtures is disclosed in commonly assigned U.S. patent application Ser. No. 09/465,073 filed Dec. 16, 1999 entitled "Non-thermal Plasma Exhaust NOx Reactor," which is hereby incorporated by reference herein in its entirety. Disclosed therein is a reactor element comprising high dielectric, nonporous, high temperature insulating means defining a group of relatively thin stacked cells forming passages and separated by insulating means. Alternate ground and charge carrying electrodes are disposed on opposite sides of the cells in the insulating means. The ground and charge carrying electrodes reside close to the cells, but are insulated therefrom by the insulating means. Such electrodes may be, for example, silver or platinum material coated onto alumina plates. Conductive ink is sandwiched between two thin nonporous alumina plates or other suitable insulating plates to prevent arcing while providing a stable electrode spacing for a uniform electric field. The electrodes are coated onto alumina in a pattern that establishes a separation between the electrodes and the connectors of alternate electrodes suitable to prevent voltage leaks.

Commonly assigned U.S. patent application Ser. No. 60/141,427 filed Jun. 29, 1999 entitled "Design and Method of Manufacturing a Plasma Reactor for Treating Auto Emissions—Stacked Shapes," which is hereby incorporated by reference herein in its entirety, discloses a non-thermal plasma reactor element prepared from a planar arrangement of formed shapes of dielectric material. The shapes are used as building blocks for forming the region of the reactor wherein the plasma is generated. Individual cells are provided with a conductive print disposed on the formed shapes to form electrodes and connectors. In a preferred embodiment, the conductive print comprises a continuous grid pattern having a cutout region disposed opposite the terminal connector for reducing potential charge leakage. Multiple cells are stacked and connected together to form a multi-cell reactor element.

Commonly assigned U.S. patent application Ser. No. 09/517,681 filed Mar. 2, 2000 entitled "Plasma Reactor Design for Treating Auto Emissions—Durable and Low Cost," which is hereby incorporated by reference herein in its entirety, discloses a non-thermal plasma reactor element for conversion of exhaust gas constituents. The reactor comprises an element prepared from an extruded monolith of dense dielectric material having a plurality of channels separated by substantially planar dielectric barriers. Conductive material printed onto selected channels form conductive channels that are connected along bus paths to form an alternating sequence of polarity, separated by exhaust channels. Conductive channels and channels not selected for exhaust flow are plugged at end portions of the monolith with a material suitable for excluding exhaust gases and preventing electrical charge leakage between conductive channels. Exhaust channels, disposed between opposite polarity conductive channels, are left uncoated and unplugged. During operational, exhaust gas flows through exhaust channels and is treated by the high voltage alternating current plasma field. The planar shape of the dielectric barriers provides a uniform electrical response throughout the exhaust channels.

Commonly assigned U.S. patent application Ser. No. 09/517,682 filed Mar. 2, 2000 entitled "Method of Manufacture of a Plasma Reactor with Curved Shape for Treating Auto Emissions," which is hereby incorporated by reference herein in its entirety, discloses a non-thermal plasma reactor element wherein a swept shape substrate is formed and treated to create a non-thermal plasma reactor element. The substrate is formed via extrusion so that there is a series of nested, concentric dielectric barriers. Selected channels are coated with conductive material to form conductor channels capable of forming an electric field around exhaust channels. Conductive channels and channels not selected for exhaust flow are plugged at end portions of the monolith with a material suitable for excluding exhaust gases and preventing electrical charge leakage between conductive channels. Exhaust channels, disposed between opposite polarity conductive channels, are left uncoated and unplugged.

Commonly assigned U.S. Provisional Application Serial No. 60/249,231 filed November 16, entitled "Edge-Connected Non-Thermal Plasma Exhaust After-Treatment Device," which is hereby incorporated by reference herein in its entirety, discloses a non-thermal plasma reactor element design where continuous edge connectors are used to provide an improved barrier to charge leakage between electrodes and between electrodes and bus paths or the housing. As a result of these improved barriers to charge leakage, electrodes can be extended up to the edge connector—increasing volumetric efficiency compared to current stacked plate designs with spacers. The locations of dielectric barriers are more exact compared to earlier stacked designs using spacers, thus increasing the usable power range of the reactor with plasma present in all cells. The overall height of the subject invention is more closely controlled than for a stacked reactor design, allowing low-cost packaging techniques to be used. Also, a conductive print design is disclosed where the electrode print on the dielectric barriers extends over a large area with integral bus connection paths toward the front (or back) of the reactor. This design allows the edge connectors to be comprised entirely of a dielectric composition and without the need for vias or through slots, while eliminating the possibility of charge leakage. Bus connections are accomplished at the front (or rear) of the stack for each polarity. Subsequently, the bus paths are connected to power and ground connections. All electrical paths and connection may be covered by a dielectric encapsulent. Further a scaleable non-thermal plasma reactor element is disclosed wherein a linking edge connector is employed to efficiently join multiple elements together for increased flow treatment capability while providing key structural support for the scaled assembly.

While the above-described non-thermal plasma reactors meet some of the current needs and objectives, several problems relating to improving reactor performance, reducing manufacturing complexity, and reducing overall cost require solutions. Some of the problems to be solved include, for example, current stacked planar designs have a parting line when stacked that lies in the same plane as the metal electrode print. Due to the finite thickness of the metal electrode print as well as any camber or thickness variation that may be present in one or both of the dielectric layers, there is a gap that results between the layers. When the device is energized with high voltage, there is a tendency for charge to leak through this gapped parting line to the nearest ground path, causing thermal arcing. One known method for addressing the arcing problem, is to separate the edge of the electrode from the edge of the dielectric by a suitable distance, such as about 19 mm. This effectively reduces the potential active area of the electrode by an amount equal to the amount of separation.

Current stacked planar designs also require substantial fixturing to align pieces during assembly. Planar designs using metallized plates and discrete spacers need fixturing to hold each spacer in place relative to the metallized plates during assembly. Reactors employing formed C-shapes or box shapes eliminate the need for spacers. However, fixturing is still required to align the shapes into the stack.

Current stacked planar designs constructed from metallized plates and discrete spacers have many pieces that are relatively expensive to assemble due to excessive handling, although planar C-shapes or box shapes are less expensive to assemble.

Current stacked planar designs rely upon a stack of substrates or shapes that determine the overall height. Since each layer has a thickness variation and camber tolerance, electrode print thickness variation, and possibly burrs, there are substantial potential variations in stack height. This complicates canning the reactor substrate to withstand severe applications, such as automotive after-treatment, since variation that could exceed 10 mm is typically accommodated by custom sizing or other expensive canning methods.

Extruded monolithic substrates used as the basis for a non-thermal plasma reactor element are not prone to the parting line gap, excessive height variation, or excessive fixturing and handling problems. However, structural webs or ligaments within plasma channels, commonly necessary to impart structural integrity, can negatively affect constituent conversion efficiency.

Edge-connected non-thermal plasma reactor elements have improved reactor efficiency compared to extruded designs and increased volumetric efficiency compared to stacked designs. However, these designs rely upon many discrete dielectric barriers that must be assembled into the edge connectors, leading to increased material and assembly costs.

NOx reduction efforts are expected to increase for all mobile diesel applications, ranging from small passenger vehicle application to heavy-duty trucks, as well as for industrial stationary and temporary applications. Current stacked reactors provide poor scalability due to poor height control. While extruded cellular and edge connected reactor elements are scaleable, these reactors provide reduced performance or high material and assembly costs.

What is needed in the art is an improved non-thermal plasma reactor that can be scaled to work across a broad application mix with minimum changeover complications and expense. What is further needed in the art is a scaleable non-thermal reactor element providing improved reactor efficiency and volumetric efficiency at minimal average cost.

SUMMARY OF THE INVENTION

A scaleable inter-digitized tine non-thermal plasma reactor element is provided comprising at least one pair of inter-digitized tine end connectors connected together and defining gas passages between the tines. Alternate ground and charge carrying electrodes are provided on the tines. The prepared inter-digitized tine reactor element has a scaleable height, width, and length. Connectors are defined that enable efficient non-thermal reactor element fabrication for widely varying applications having various flow throughput and constituent reduction requirements.

The invention further provides a non-thermal plasma reactor that enables an inter-digitized tine reactor element to be constructed having several plasma zones that are selectively powered so that the effective length of the reactor can be adjusted during operation for optimal efficiency over a range of operating conditions. The invention further provides an inter-digitized tine mid connector providing efficient scaling of the reactor frontal area, wherein the frontal area has multiple electrodes provided in the exhaust flow direction to enable a variable active plasma zone for various operating conditions.

The invention further provides a structural carrier inter-digitized tine non-thermal plasma connector wherein the tines are defined in a side to side basis; that is, a high-k dielectric layer, electrode layer, structural dielectric, electrode layer, and high-k dielectric layer.

The invention further provides a structural conductor inter-digitized tine non-thermal plasma connector wherein the tines are defined in a side to side basis, that is, a high-k dielectric layer, structural conductor, and high-k dielectric layer.

The invention further provides double, single or null dielectric barrier inter-digitized tine non-thermal plasma reactors. The double dielectric barrier reactor comprises plasma cells (exhaust passages) that are bounded by a dielectric barrier in the plasma direction. The single dielectric barrier reactor comprises plasma cells that are bounded by a dielectric barrier on one side and by an electrode on the opposite side, in the plasma direction. The null dielectric barrier reactor comprises plasma cells that are bounded by electrodes on each side, in the plasma direction.

The present double dielectric inter-digitized tine reactors are prepared using structural carrier or structural conductor inter-digitized tine connectors.

The present single dielectric inter-digitized tine reactors are prepared using a structural carrier or structural conductor inter-digitized tine connector with a null dielectric barrier inter-digitized tine connector.

The present null dielectric barrier inter-digitized tine reactors are prepared using null dielectric barrier structural carrier or structural conductor inter-digitized tine connectors. In the null dielectric structural carrier inter-digitized tine connector, the tines are defined side to side as electrode layer, structural dielectric, and electrode layer. In the null dielectric structural conductor inter-digitized tine connector, the tines comprise structural conductor.

These and other features and advantages of the invention will be more fully understood from the following description of certain specific embodiments of the invention taken together with the accompanying drawings.

BRIEF DESCRIPTION OF THE DRAWINGS

Referring now to the drawings, which are meant to be exemplary, not limiting, and wherein like elements are numbered alike in the several Figures:

FIG. 1 is a view of a structural carrier inter-digitized tine end connector.

FIG. 2 is a view of a structural conductor inter-digitized tine end connector.

FIG. 3 is a view of a null dielectric barrier structural carrier inter-digitized tine end connector.

FIG. 4 is a view of a null dielectric barrier structural conductor inter-digitized tine end connector.

FIG. 9 is a view of a structural carrier inter-digitized tine mid connector.

FIG. 10 is a view of a null dielectric barrier structural conductor inter-digitized tine mid connector.

FIG. 15 is a view of variable active length inter-digitized tine reactor element.

DESCRIPTION OF THE PREFERRED EMBODIMENT

Figure 5:
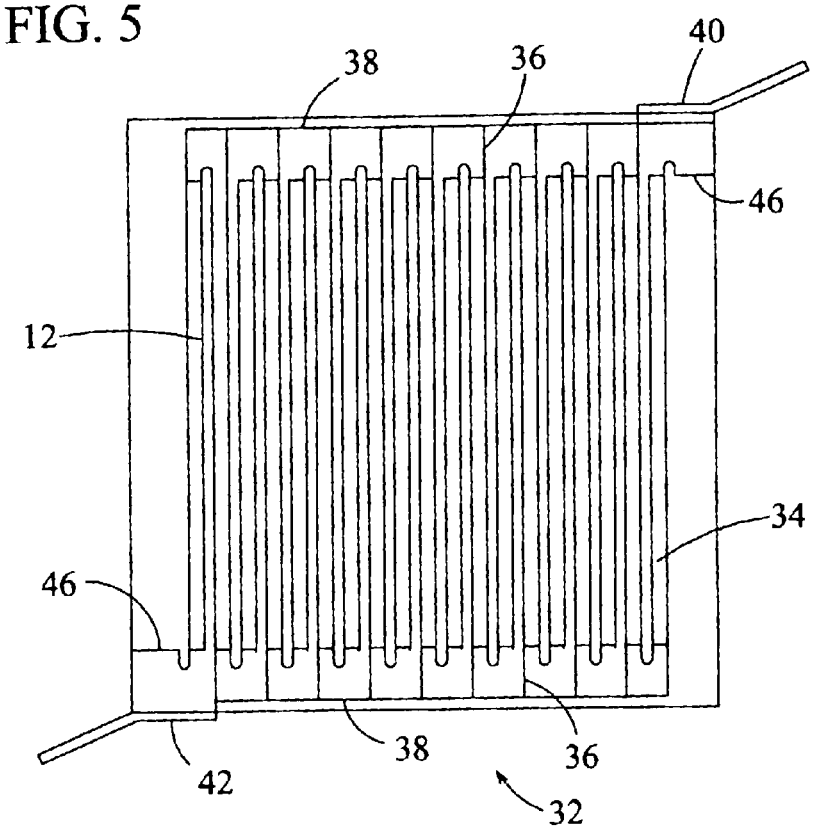
FIG. 5 is a view of a base double dielectric barrier inter-digitized tine reactor element constructed from structural carrier inter-digitized tine end connectors.

FIG. 1 depicts a structural carrier inter-digitized tine end connector 10. Two structural carrier inter-digitized tine end connectors 10 are used to build a standard sized reactor element. The present scaleable inter-digitized tine non-thermal plasma reactor elements may be scaled up to contain any number of end connectors to provide a reactor element suitable to the particular system requirements. One inter-digitized tine end connector 10 is inverted, inserted into another inter-digitized tine end connector 10, and secured, to make a double dielectric inter-digitized tine reactor element (such as the double dielectric inter-digitized tine reactor element 32 shown in FIG. 5).

The structural carrier inter-digitized tine end connector shape is constructed from a structural dielectric core 20 (shown in enlarged details X and Z). The structural dielectric may comprise any material having suitable dielectric properties, including, but not limited to, alumina, cordierite, mullite, or other structural dielectrics. In the tine 12 region, the structural dielectric core 20 is layered with electrode 22 and a high dielectric constant ("high k" dielectric) material 24. In the pocket 14 region and back plane region 16, the structural dielectric core 20 is initially uncoated. The electrodes 22 are connected to the bus path 38 on the back plane 16 through bus connection paths 36. The grip-side 18 of the structural carrier inter-digitized tine end connector 10 is constructed of structural dielectric 20 with a layer of electrode 22 and high-k dielectric 24 on the inside region. The outside of the grip-side 18 comprises uncoated structural dielectric.

The base structural carrier inter-digitized tine end connector shape is typically formed by extrusion, although it may be formed by any suitable means. Pocket regions 14 and back plane 16 surfaces between tines are masked and the tine regions 12 are coated with electrode 22 using dipping, spraying, vaporizing, plating, or other methods. Bus connection paths and bus paths are also formed at this same time using similar techniques known in the art. Dielectric 24 is then applied over all electrode regions using dipping, spraying, vaporizing, plating, laminating, or other known processes.

In an alternate embodiment, the structural carrier inter-digitized tine end connector 10 is constructed from sections. This approach requires more pieces but uses simpler manufactured materials and assembly. Tines 12 may be constructed from electrode coated and dielectric coated dielectric plates, by two one-side electrode coated dielectric plates sandwiched together, or by an electrode-dielectric laminate. The coated plates are inserted into the pockets 14 of an edge connector and secured, such as with high-temperature capable adhesive. In this embodiment, the bus connecting paths 36 are formed directly on the tine plates 12 prior to assembly into the connector. The electrode is set back a distance from the front and back regions of the tine plates, typically from about 2 to about 15 mm. This set back distance reduces the potential for charge leakage at the front or rear of the reactor and between alternate polarity plates in the assembled reactor during operation. When assembled into the edge connector, the bus connection paths 36 fit inside the edge connector pockets 14 and run to the front (or rear) of the connector. The bus path 38 is formed at the front or rear of the element using thick film conductor composition and subsequently covered with dielectric encapsulent.

FIG. 2 depicts a structural conductor inter-digitized tine end connector 26. Two structural conductor inter-digitized tine end connectors 26 are combined to prepare a standard sized reactor element with the addition of dielectric spacers. During fabrication, one structural conductor inter-digitized tine end connector 26 is inverted, inserted into a second inter-digitized tine end connector 26, and secured with ceramic spacers in place forming a double dielectric inter-digitized tine reactor element (such as the double dielectric inter-digitized tine reactor element 48 shown in FIG. 6).

The structural conductor inter-digitized tine end connector shape is constructed from a structural metallic. The structural metallic typically comprises stainless steel or steel, although any suitable structural metallic may be employed. In the tine 12 region, the metallic core 22 is layered with high-k dielectric 24 (shown in detailed enlargements X and Z). The metal core 22 serves as the electrodes, bus paths, and bus. The entire part is covered with dielectric.

The base structural conductor inter-digitized tine end connector shape is typically formed by extrusion. Dielectric layer 24 is applied over the entire metallic structural conductor inter-digitized tine end connector shape using dipping, spraying, vaporizing, plating or other known methods.

Optionally, a structural conductor inter-digitized tine end connector 26 may be constructed from sections. This approach requires more pieces but uses simpler manufactured materials and assembly. Tines 12 may be prepared, for example, from high-k dielectric coated metal tine plates. The plates are inserted into pockets 14 in a metallic or ceramic edge connector.

With a metallic edge connector, the tines 12 may be secured using the same dielectric coating that is used to cover the metallic edge connector 24. Brazing or adhesive bonding may also be used with subsequent dielectric coating 24 of the metallic edge connector.

With a ceramic edge connector, the plate tines 12 are secured into the pockets 14 using a high-temperature capable adhesive. Bus connection paths 36 are the metal core of the tines 12, leading to the front or rear of the connector. Bus path 38 is formed at the front or rear of the element using a thick film conductor composition and is subsequently covered with encapsulent.

A null dielectric barrier structural carrier inter-digitized tine end connector 28 is shown in FIG. 3. The tine regions 12 comprise a structural ceramic core 20 having an electrode layer 22 disposed thereon. Except for the elimination of the dielectric layer 24 in the tine region 12, other details are the same as for structural carrier inter-digitized tine end connector 10 shown in FIG. 1.

A null dielectric barrier structural conductor inter-digitized tine end connector 30 is shown in FIG. 4. The tine regions 12 comprise structural conductor electrode 22. Except for the elimination of the dielectric layer 24 in the tine region 12, other details are the same as for structural conductor inter-digitized tine end connector 26 shown in FIG. 2.

The scaleable inter-digitized tine double, single or null dielectric barrier reactor elements are provided using an inter-digitized tine construction. For the double dielectric barrier embodiment, plasma cells are bounded by dielectric barrier in the plasma direction. For the single dielectric barrier embodiment, plasma cells are bounded by a dielectric barrier on one side and by an electrode on the other side, in the plasma direction. For the null dielectric barrier embodiment, plasma cells are bounded by electrodes on each side, in the plasma direction.

Structural carrier 10 or structural conductor 26 inter-digitized tine end connectors are used to prepare double dielectric inter-digitized tine reactor elements.

Structural carrier 10 or structural conductor 26 inter-digitized tine end connectors are used with null dielectric barrier structural carrier 28 or null dielectric barrier structural conductor 30 inter-digitized tine connectors to prepare single dielectric reactor elements.

The null dielectric reactor element is prepared using null dielectric barrier structural carrier 28 or null dielectric barrier structural conductor 30 inter-digitized tine connectors.

A base double dielectric barrier inter-digitized tine reactor element 32 prepared with structural carrier inter-digitized tine end connectors 10 is shown in FIG. 5. The end of the tines 12 fit into retention pockets 14 until joint lines 46 are formed. The two end connectors 10 are joined at the joint lines 46 using ceramic cement, glass composition, or other known high temperature capable bonding methods. Optionally, the end connectors 10 may be joined at the outer wall of the element using adhesives, band clamps, or by applying mat pressure when packaged. Exhaust gas flows through exhaust channels 34 during operation. The power connection to the element 32 is made at the power connect terminal 40. The ground connection to the element 32 is made at the ground connect terminal 42.

Figure 6:
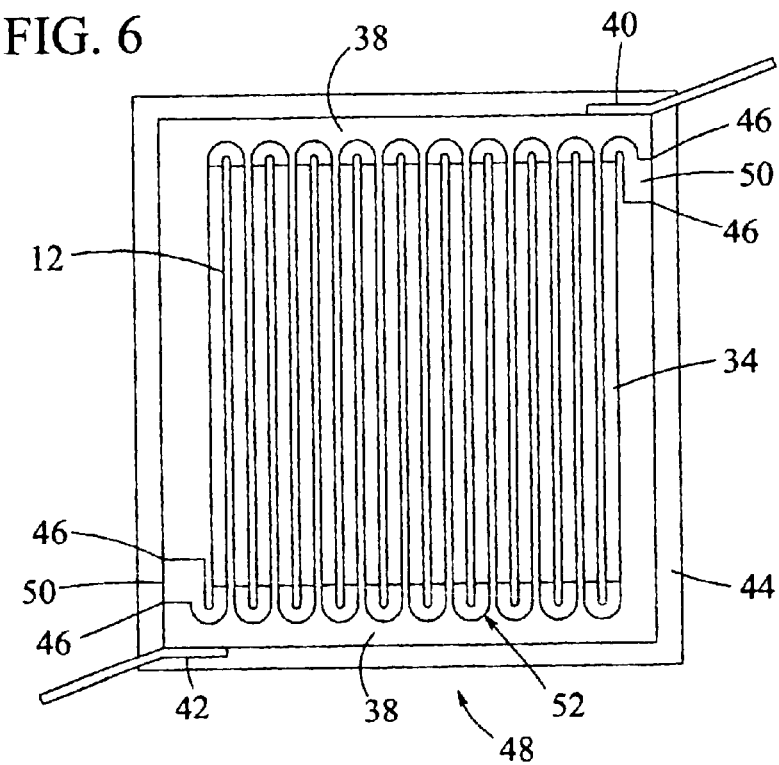
FIG. 6 is a view of a base double dielectric barrier inter-digitized tine reactor element constructed from structural conductor inter-digitized tine end connectors.

A base double dielectric barrier inter-digitized tine reactor element 48 prepared with structural conductor inter-digitized tine end connectors 26 is shown in FIG. 6. The ends of the tines 12 fit into dielectric tine guides 52 that fit into retention pockets 14 until joint lines 46 are formed with insulating spacers 50. Exhaust gas flows through exhaust channels 34 during operation. Power connection 40 is made directly to the outer wall of power structural conductor inter-digitized tine end connector 26 using a weld. Ground connection 42 is similarly made to the ground structural conductor inter-digitized tine end connector 26. An insulating coating layer 44 is applied over the outer surface of the element 48 to join the connector together as well as to provide electrical insulation between the element 48 and the housing (not shown).

Figure 7:
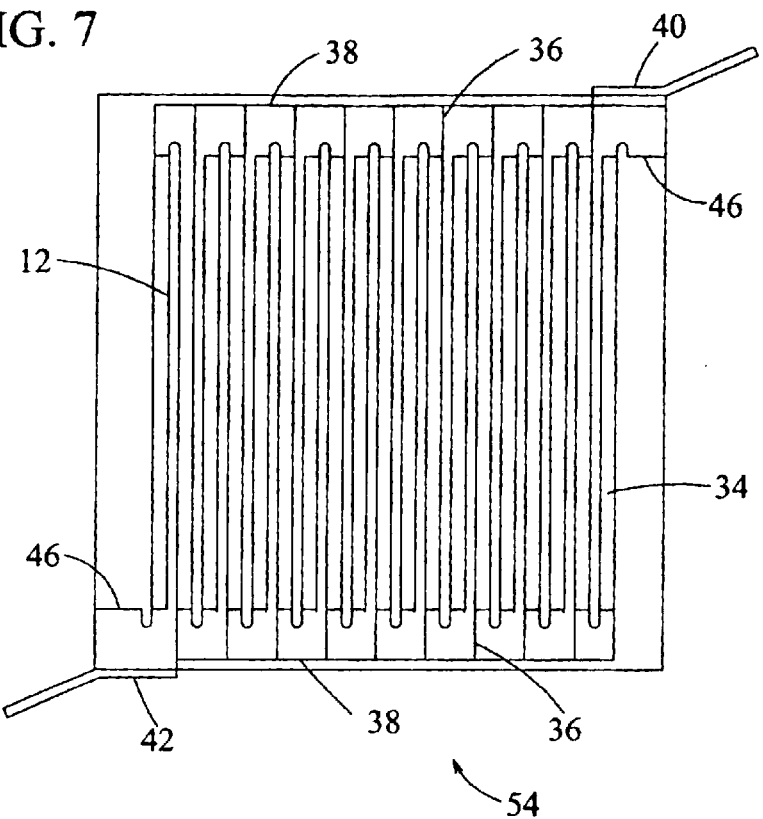
FIG. 7 is a view of a base single dielectric barrier inter-digitized tine reactor element constructed from structural carrier inter-digitized tine end connector and null dielectric barrier structural carrier inter-digitized tine end connector.

A single dielectric barrier inter-digitized tine reactor element 54 prepared with a structural carrier inter-digitized tine end connector 10 and null dielectric barrier structural carrier inter-digitized tine end connector 28 is shown in FIG. 7. The ends of the tines 12 fit into the retention pockets 14 until joint lines 46 are formed. The two end connectors 10, 28 are joined at the joint lines 46 using ceramic cement, glass composition, or other known high temperature capable bonding method. Optionally, the end connectors 10, 28 may be joined at the outer wall of the element 54 using adhesives, band clamps, or by applying mat pressure when packaged. Exhaust gas flows through exhaust channels 34 during operation. The power connection to the element 54 is made at the power connect terminal 40. The ground connection to the element 54 is made at the ground connect terminal 42.

A single dielectric barrier inter-digitized tine reactor element may also be constructed from structural conductor inter-digitized tine end connectors. Structural conductor inter-digitized tine end connector 26 is married with null dielectric barrier structural conductor inter-digitized tine end connector 30. Assembly is the same as for the double dielectric inter-digitized tine reactor element 48 shown in FIG. 6.

Figure 8:
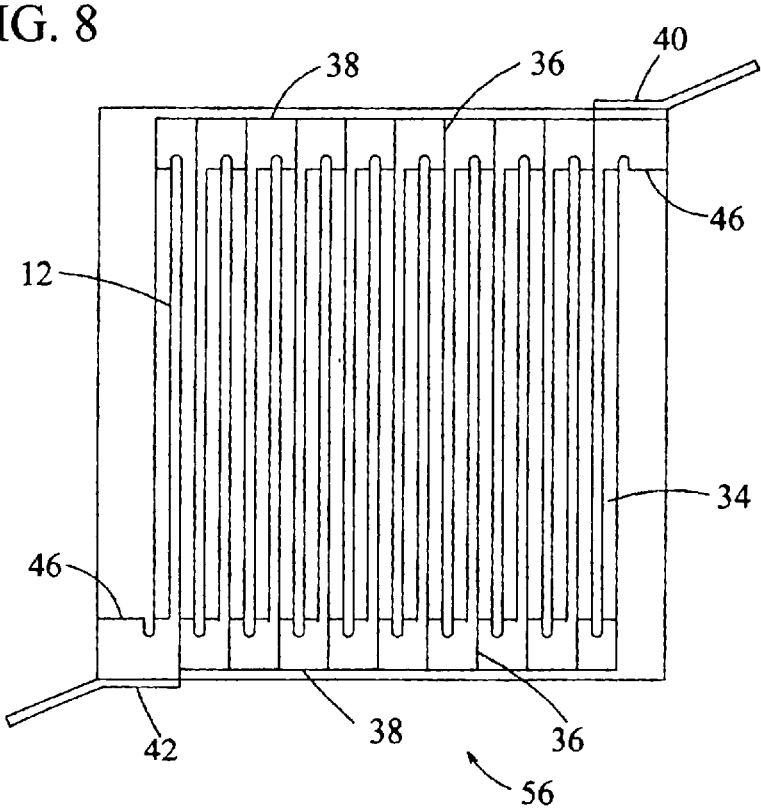
FIG. 8 is a view of a base null dielectric barrier inter-digitized tine reactor element constructed from null dielectric barrier structural carrier inter-digitized tine end connectors.

A null dielectric barrier inter-digitized tine reactor element 56 prepared with null dielectric barrier structural carrier inter-digitized tine end connectors 28 is shown in FIG. 8. The end of the tines 12 fit into the retention pockets 14 until joint lines 46 are formed. The two end connectors 28 are joined at the joint lines 46 using ceramic cement, glass composition, or other known high temperature capable bonding methods. Optionally, the end connectors 28 are joined at the outer wall of the element 56 using adhesives, band clamps, or mat pressure when packaged. Exhaust gas flows through exhaust channels 34 during operation. The power connection to the element 56 is made at the power connect terminal 40. The ground connection to the element 56 is made at the ground connect terminal 42.

A null dielectric barrier inter-digitized tine reactor element may also be constructed from structural conductor inter-digitized tine end connectors. In this embodiment, null dielectric barrier structural conductors 30 are used. Assembly is the same as for the double dielectric inter-digitized tine reactor element 48 shown in FIG. 6.

Multiple elements may be stacked and bonded together, side to side and top to bottom, as required, in order to increase the frontal area of the element to support high flow rates. While this embodiment comprising multiple stacked elements enables frontal area scaling using base inter-digitized tine reactor elements two inter-digitized end connectors are required for each scaling increment.

Inter-digitized tine mid connectors, shown in FIGS. 9 and 10, are used to efficiently scale inter-digitized reactors for increased frontal area. The inter-digitized tine mid connector enables a scaled frontal area element having twice the frontal area of a standard element to be constructed from two inter-digitized tine end connectors and an inter-digitized tine mid connector. Further, a scaled frontal area element providing three times the frontal area of a standard element is prepared using two inter-digitized tine end connectors and two inter-digitized tine mid connectors. Structural carrier inter-digitized tine mid connector 58 is shown in FIG. 9 providing an optimized minimal number of bus paths 38 and ground connections 42. Further, this embodiment provides an optimized minimum thickness for the back plane 16.

Structural carrier inter-digitized tine mid connector 58 has tines 12 and retention pockets 14 on each side of the common back plane 16. The structural carrier inter-digitized tine mid connector 58 shape is constructed from a structural dielectric core 20. The structural dielectric may comprise alumina, cordierite, mullite, or other structural dielectric. In the tine 12 region, the structural dielectric core 20 is layered with electrode 22 and high-k dielectric 24 (shown in enlarged details X and Z). In the pocket 14 region and back plane region 16, the structural dielectric core 20 is initially uncoated. The electrodes 22 are connected to the bus path 38 on the back plane 16 through bus connection paths 36. The grip-side 18 of the structural carrier inter-digitized tine mid connector 58 is constructed of structural dielectric 20 with a layer of electrode 22 and high-k dielectric 24 on the inside region. The outside of the grip-side 18 comprises uncoated structural dielectric.

Typically, the inter-digitized tine mid connectors have pockets 14 and tines 12 that are shifted relative to each on the opposite side, as in FIG. 9. This provides maximum back plane 16 strength since pockets 14 reduce the section thickness of the back plane 16. As shown in FIG. 10, pockets 14 and tines 12 may not be shifted if adequate strength is achieved with reduced backbone 16 section thickness and if cost is less than for shifted pockets 14 and tines 12.

The structural carrier inter-digitized tine mid connector shape is typically formed by extrusion. Pocket regions 14 and back plane 16 surfaces between tines are masked and the tine regions 12 are coated with electrode 22 using dipping, spraying, vaporizing, plating, or other suitable coating method. Bus connection paths 36 and bus path 38 are also formed at this same time using similar techniques. Dielectric 24 is then applied over all electrode coated regions using dipping, spraying, vaporizing, plating, laminating, or other known processes.

In an alternate embodiment, the structural carrier inter-digitized tine mid connector 58 is prepared from multiple sections. While there are more components to be assembled using this technique, simpler manufactured materials and assembly methods are used. The tines 12 may be constructed from electrode coated and dielectric coated dielectric plates, by two one-side electrode coated dielectric plates sandwiched together, or by an electrode-dielectric laminate. The plates are inserted into pockets 14 in an edge connector and secured with high-temp capable adhesive. With this approach, the bus connecting paths 36 are formed directly on the tine plates 12 prior to assembly into the connector. The electrode is set back a distance from the front and back regions of the tine plates, such as, for example, by about 2 to about 15 mm. This set back distance reduces the potential for charge leakage at the front or rear of the reactor and between alternate polarity plates in the assembled reactor during operation. When assembled into the edge connector, the bus connection paths 36 fit inside the edge connector pockets 14 and run to the front (or rear) of the connector. The bus path 38 is formed at the front or rear of the element using thick film conductor composition and is subsequently covered with encapsulent.

A structural conductor inter-digitized tine mid connector as used herein has tines 12 and retention pockets 14 on each side of the common back plane 16. The structural conductor inter-digitized mid connector shape is constructed from a structural metallic, such as, for example, stainless steel or steel. In the tine 12 region, the metallic core 22 is coated with high-k dielectric 24. The metal core 22 serves as the electrodes, bus paths, and bus connections. The structural conductor inter-digitized tine mid connector is substantially covered with dielectric.

The structural conductor inter-digitized tine mid connector shape is typically formed by extrusion. Dielectric layer 24 is applied over substantially all of the metallic structural conductor inter-digitized tine mid connector shape using dipping, spraying, or other suitable means.

Optionally, a structural conductor inter-digitized tine mid connector may be constructed from sections. This approach requires more pieces but uses simpler manufactured materials and assembly. Tines 12 may be constructed from high-k dielectric coated metal tine plates. These plates are inserted into pockets 14 in a metallic or ceramic mid connector.

With a metallic edge connector, the tines 12 may be secured using the same dielectric coating that is used to cover a metallic edge connector. Brazing or adhesive bonding may also be used with subsequent dielectric coating 24 of the metallic edge connector.

With a ceramic edge connector, the plate tines 12 are secured into the pockets 14 using a high-temperature capable adhesive. The metal core of the tines 12 comprise the bus connection paths 36 leading to the front or rear of the connector. Bus path 38 is formed at the front or rear of the element using a thick film conductor composition and is subsequently covered with encapsulent.

The null dielectric barrier structural carrier inter-digitized tine mid connector used herein has tines 12 and retention pockets 14 on each side of the common back plane 16. The tine regions 12 are defined as structural ceramic core 20 with electrode layer 22. Except for the elimination of the dielectric layer 24 in the tine region 12, other details are the same as for structural carrier inter-digitized tine mid connector 58.

A null dielectric barrier structural conductor inter-digitized tine mid connector is shown in FIG. 10. The tine regions 12 comprise the structural conductor 22. Except for the elimination of dielectric layer 24 in the tine region 12, other details are the same as for structural conductor inter-digitized tine mid connector 58.

Various grip 18 configurations are provided for the structural carrier or structural conductor inter-digitized tine mid connectors. In FIG. 9, the structural carrier inter-digitized tine mid connector 58 is shown with duplicate flipped grips 18. In FIG. 10, the structural conductor inter-digitized tine mid connector 76 is shown with a long grip 18 on one side and with a short grip 18 on the other side.

Scaled double, single or null dielectric barrier reactor elements are provided using an inter-digitized tine tine construction. In the double dielectric barrier element, the plasma cells are bounded by dielectric barrier in the plasma direction. In the single dielectric barrier element, the plasma cells are bounded by a dielectric barrier on one side and by an electrode on the other side, in the plasma direction. In the null dielectric barrier element, plasma cells are bounded by electrodes on each side, in the plasma direction.

In preparing the scaled double dielectric inter-digitized tine reactor element, structural carrier or structural conductor inter-digitized tine connectors are used. For the scaled single dielectric inter-digitized tine reactor element, a structural carrier or structural conductor inter-digitized tine connector is used with null dielectric barrier structural carrier or structural conductor inter-digitized tine connector. For the scaled null dielectric inter-digitized tine reactor element, null dielectric barrier structural carrier or structural conductor inter-digitized tine connectors are used.

Figure 11:
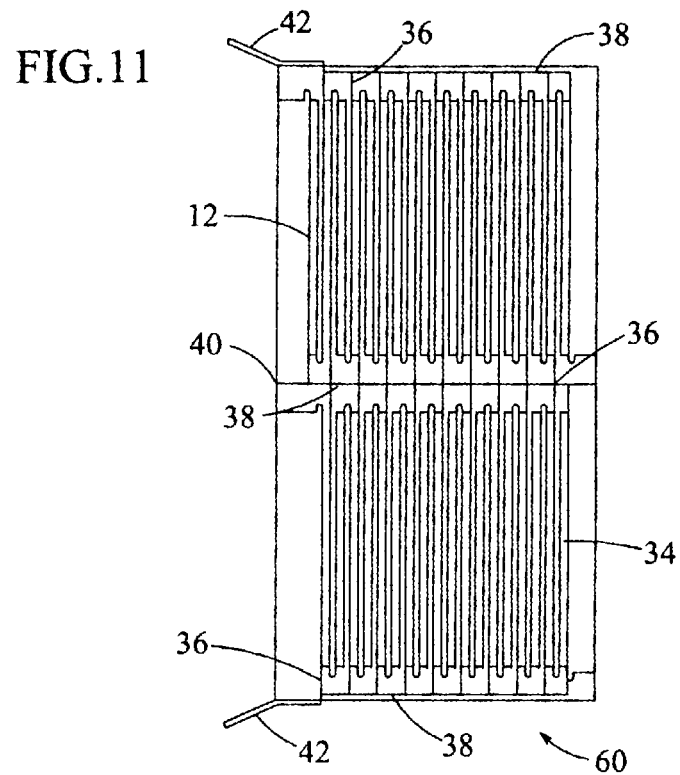
FIG. 11 is a view of a scaled-up double dielectric inter-digitized tine reactor element constructed from structural carrier inter-digitized tine end connectors.

A scaled-up frontal area double dielectric inter-digitized tine reactor element 60 constructed from structural carrier inter-digitized tine end connectors 10 and structural carrier inter-digitized tine mid connector 58 is shown in FIG. 11. By adding the structural carrier inter-digitized mid connector 58, the frontal area is increased in the tine direction. Typically the element is disposed in the reactor housing so that when installed the tines are oriented vertically. This minimizes the bending moment that can occur with the tines are oriented other than vertically. Thus, adding mid connector 58 generally increases the height of the element. The height of the element can also be affected by the length of the tines 12.

In order to increase the frontal area by extending in the direction 90 degrees from the tines, generally the element width, it is desirable to selectively prepare the end connectors and mid connector with increased length. This is accomplished via extrusion of the shape, for example, or alternately through an increase in the length of an element constructed from sections. With an increase in the element width, the number of tines 12 and exhaust channels 34 increase also. Scaling the extent of the element 60 in height and width orientation enables one to keep the number of necessary bus paths 38 to the minimum practical level.

The scaled up double dielectric inter-digitized tine reactor element 60 is assembled by inserting the inter-digitized tine mid connector 58 into the inter-digitized tine end connector 10 and inserting another inter-digitized tine end connector 10 into the unfilled side of the inter-digitized tine mid connector 58. The end of the tines 12 fit into retention pockets 14 until joint lines 46 are formed. The connectors 10, 58 are joined at the joint lines 46 using ceramic cement, glass composition, or other known high temperature capable bonding methods. Optionally, the connectors 10, 58 are joined at the outer wall of the element using adhesives, band clamps, or mat pressure when packaged. Exhaust gas flows through exhaust channels 34 during operation. The power connection is made to the element 60 is made at the power connect terminal 40. The ground connection to the element 60 is made at the ground connect terminal 42.

Figure 12:
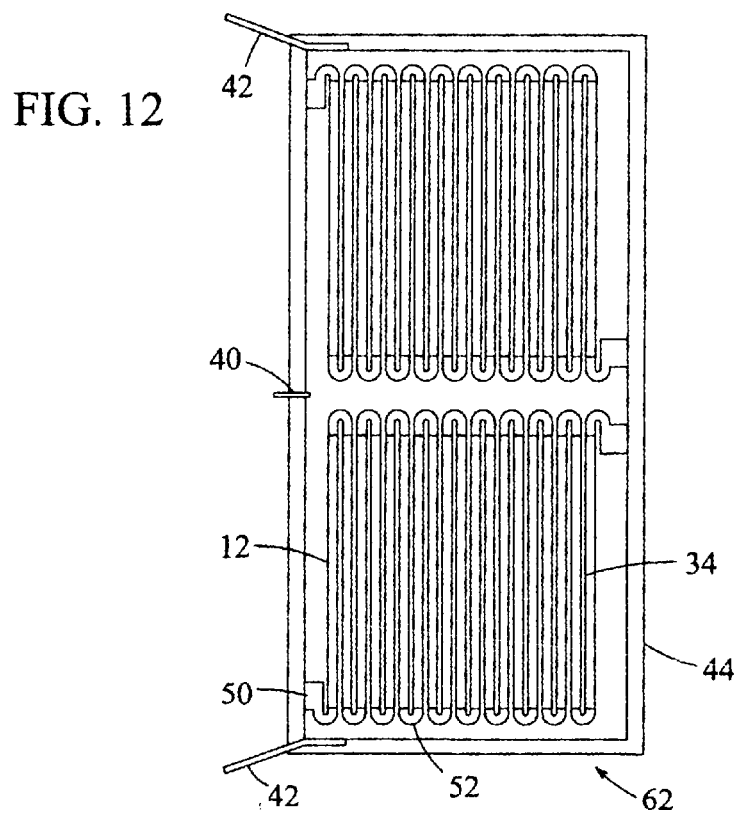
FIG. 12 is a view of a scaled-up double dielectric inter-digitized tine reactor element constructed from structural conductor inter-digitized tine end connectors.

A scaled-up double dielectric barrier inter-digitized tine reactor element 62 constructed from structural conductor inter-digitized tine end connectors 26 and structural conductor inter-digitized tine mid connector is shown in FIG. 12. The end of the tines 12 fit into dielectric tine guides 54 that fit into retention pockets 14 until joint lines 46 are formed with insulating spacers 50. Power connection 40 is made directly to the outer wall of power structural conductor inter-digitized tine end connector 26 using a weld. Ground connection 42 is similarly made to the ground structural conductor inter-digitized tine end connector 26. Insulating coating layer 44 is applied over the outer surface of the element 48 to join the connector together as well as to provide electrical insulation between the element 48 and housing (not shown). Exhaust gas flows through exhaust channels 34 during operation.

A scaled-up single dielectric barrier inter-digitized tine reactor element is constructed from structural carrier inter-digitized tine end connectors 10 and null dielectric barrier structural carrier inter-digitized tine mid connector or is comprised from null dielectric barrier structural carrier inter-digitized tine end connectors 28 and structural carrier inter-digitized tine mid connector 58. The end of the tines 12 fit into retention pockets 14 until joint lines 46 are formed. The two end connectors 10, 28 are joined at the joint lines 46 using ceramic cement, glass composition, or with other known high temperature capable bonding methods. Optionally, the end connectors 10, 28 are joined at the outer wall of the element using adhesives, band clamps, or mat pressure when packaged. Exhaust gas flows through exhaust channels 34 during operation. The power connection to the element is made at the power connect terminal 40. The ground connection to the element is made at the ground connect terminal 42.

Alternately, a scaled-up single dielectric barrier inter-digitized tine reactor element is constructed from structural conductor inter-digitized tine connectors. Structural conductor inter-digitized tine end connectors 26 are married with a null dielectric barrier structural conductor mid connector or null dielectric barrier structural carrier inter-digitized tine end connectors 30 are joined to a structural carrier inter-digitized tine mid connector. Assembly is similar to double dielectric structural conductor inter-digitized tine reactor element 48 shown in FIG. 6.

A scaled null dielectric barrier inter-digitized tine reactor element is constructed from null dielectric barrier structural carrier inter-digitized tine connectors. The end of the tines 12 fit into retention pockets 14 until joint lines 46 are formed. The connectors are joined at the joint lines 46 using ceramic cement, glass composition, or with other known high temperature capable bonding methods. Optionally, the end connectors 28 are joined at the outer wall of the element 56 using adhesives, band clamps, or mat pressure when packaged. Exhaust gas flows through exhaust channels 34 during operation. The power connection to the element 56 is made at the power connect terminal 40. The ground connection to the element 56 is made at the ground connect terminal 42.

A null dielectric barrier inter-digitized tine reactor element is alternately constructed from structural conductor inter-digitized tine connectors. Null dielectric barrier structural conductor connectors 28, 76 are used. Assembly is similar to that for the double dielectric structural conductor inter-digitized tine reactor element 48 shorten in FIG. 6.

Figure 13:
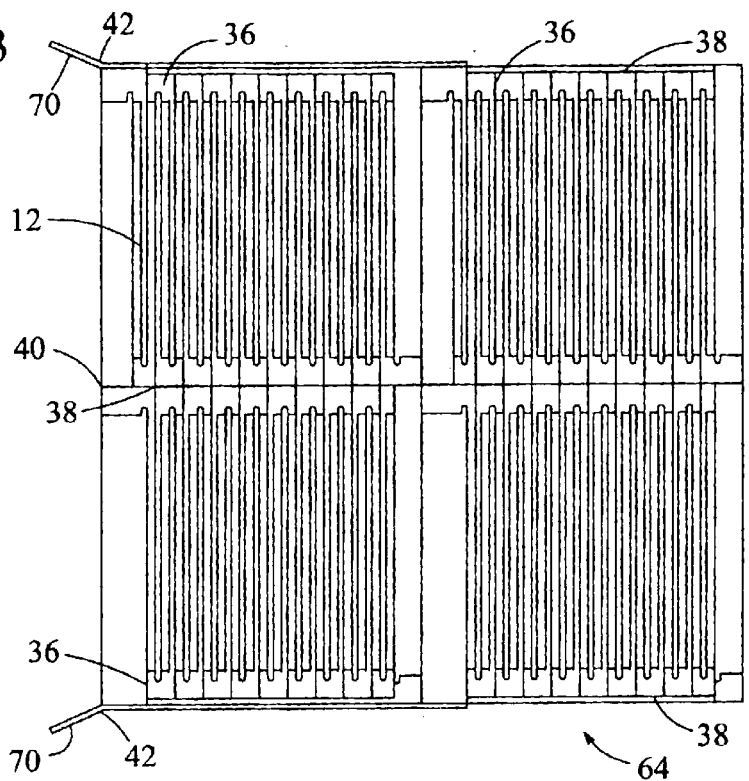
FIG. 13 is a view of a twice scaled-up double dielectric inter-digitized tine reactor element constructed from structural carrier inter-digitized tine end connectors.

A scaled-up double dielectric structural carrier inter-digitized tine reactor element 64 comprised from multiple reactor elements is shown in FIG. 13. This reactor is useful for achieving various reactor widths using standard size connectors. Typically, mid connectors are used to increase the height of the element.

The present method includes connecting multiple elements together to increase the width. The mechanical connection between the elements is accomplished using, for example, a high-temperature capable cement, glass or metallic braze alloy. For dielectric joints, jumpers 70 are attached to connect the bus lines 38 from each element over the joint line using suitable connect methods, such as wire or ribbons and brazing, welding, or adhesive methods. Typically, the jumpers 70 are subsequently covered by a dielectric encapsulent layer to prevent contamination. If the joint line between elements is conductive, then a dielectric crossover is typically applied under the jumper at and around the joint line prior to installation of the jumper 70.

Figure 14:
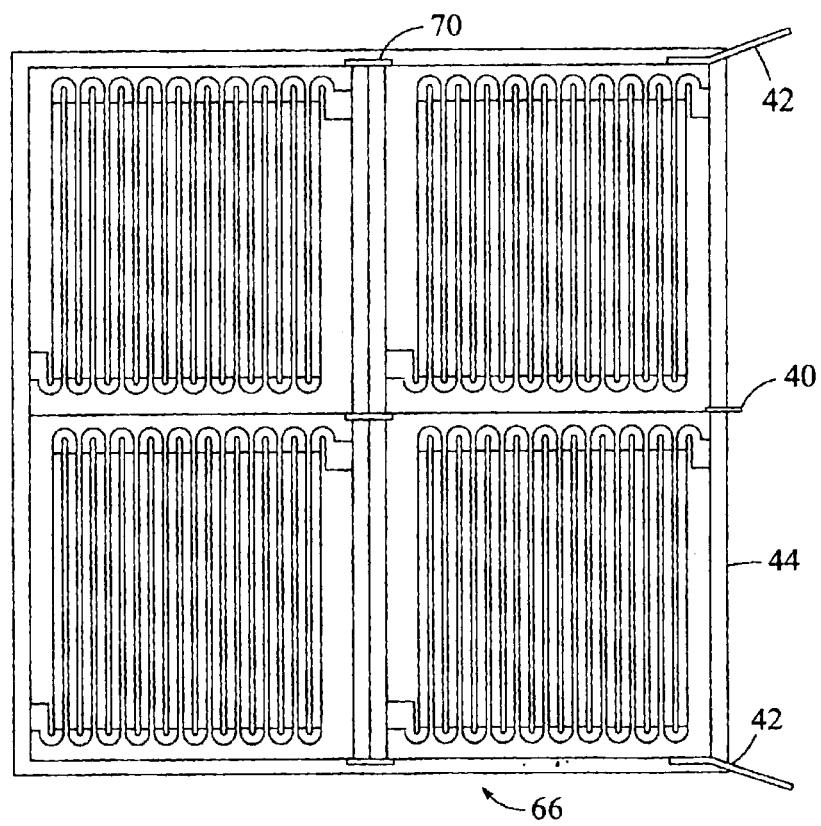
FIG. 14 is a view of a twice scaled-up double dielectric inter-digitized tine reactor element constructed from structural conductor inter-digitized tine end connectors.

A scaled-up double dielectric structural conductor inter-digitized tine reactor element 64 prepared from multiple reactor elements is shown in FIG. 14. Preferably, the mechanical connection between the elements comprises a dielectric. Mechanical connection may comprise, for example, a high-temperature capable cement or glass. If desired, a dielectric board (not shown) may be used if the joint line to assure that the elements are insulated. Jumpers 70 are attached to connect the bus lines 38 from each element over the joint line using wire or ribbons and brazing, welding, or adhesive methods. Typically, the jumpers 70 are subsequently covered by a dielectric encapsulent layer to prevent contamination.

FIG. 15 shows a variable effective length reactor 72. In this embodiment, multiple active zones (indicated as zones 1, 2, 3, and 4 in FIG. 15) are provided by using several pieces for the length, each piece typically separated by an insulating zone spacer 74 (shown in section A—A of FIG. 15). Where the inter-digitized tine connectors are prepared from sections and the electrodes are set back away from the front and back, a dielectric zone spacer is not required. The zones are attached together, such as with a high temperature capable cement or glass at the parting lines and on the outside of the assembly. Each zone is capable of being powered separately or in conjunction with other zones. Normally the ground connection is isolated for each zone and the operation of the zone is dependent upon the ground switch status. The power connection is normally common across all zones. By powering one, several, or all of the zones, a wide-variety of effective active lengths can be achieved.

While the invention has been described by reference to certain preferred embodiments, it should be understood that numerous changes could be made within the spirit and scope of the inventive concepts described. Accordingly, it is intended that the invention not be limited to the disclosed embodiments, but that it have the full scope permitted by the language of the following claims.

What is claimed is:

1. A scaleable inter-digitized tine non-thermal plasma reactor element comprising:
    at least one pair of inter-digitized tine end connectors connected together and defining gas passages between tines;
    alternate ground and charge carrying electrodes provided on said tines;
    said inter-digitized tine reactor element having a scaleable height, width, and length, selected to provide a plurality of active plasma zones during reactor operation.

2. The scaleable reactor of claim 1, wherein a frontal area of said reactor element has multiple electrodes provided in the exhaust flow direction to enable a variable active plasma zone for various operating conditions.

3. The scaleable reactor of claim 1, wherein said reactor element comprises a double dielectric barrier element having exhaust passages bounded by a dielectric barrier in the plasma direction.

4. The scaleable double dielectric barrier reactor element of claim 3 comprising:
    structural carrier dielectric connectors.

5. The scaleable double dielectric barrier reactor element of claim 3 comprising:
    structural conductor connectors.

6. The scaleable reactor of claim 1, wherein said reactor element comprises a single dielectric barrier element having exhaust passages bounded by a dielectric barrier on a first side and by an electrode on a second opposite side in the plasma direction.

7. The scaleable single dielectric reactor element of claim 6 comprising:
    a structural carrier dielectric connector; and
    a null dielectric barrier structural carrier connector.

8. The scaleable single dielectric reactor element of claim 6, wherein said reactor element comprises:
    a structural conductor connector; and
    a null dielectric barrier structural conductor connector.

9. The scaleable reactor element of claim 1, wherein said reactor element comprises a null dielectric barrier element comprising at least one pair of null dielectric barrier comb connectors, said combs having tines defined in a side to side configuration comprising a first electrode layer, a structural dielectric layer, and a second electrode layer;
    said null dielectric barrier element having exhaust passages bounded by electrodes on each side, in the plasma direction.

10. The scaleable null dielectric barrier element of claim 9 comprising:
    structural carrier connectors.

11. The scaleable null dielectric barrier element of claim 9, comprising:
    structural conductor connectors.

12. A scaleable inter-digitized tine non-thermal plasma reactor comprising the element of claim 1, further comprising:
    suitable power and ground electrical connections provided to said electrodes; and
    a housing to contain said reactor element.

13. The non-thermal plasma reactor of claim 12, wherein said reactor comprises a double dielectric barrier element, a single dielectric barrier element, or a null dielectric barrier element.

14. The non-thermal plasma reactor of claim 13, wherein said reactor comprises structural carrier dielectric connectors, structural conductor connectors, null dielectric barrier connectors, or a combination thereof.

15. A method for preparing an inter-digitized tine non-thermal plasma reactor element comprising
    connecting at least one pair of inter-digitized tine end connectors to provide an inter-digitized tine element defining gas passages between tines;

providing alternate ground and charge carrying electrodes provided on said tines;

providing said inter-digitized tine reactor element with a scaleable height, width, and length, so as to effect a plurality of active plasma zones during reactor operation.

16. The method of claim 15, further comprising:

disposing multiple electrodes in a frontal area of said element in the exhaust flow direction to enable a variable active plasma zone in accordance with variable operating conditions.

17. The method of claim 15, wherein said reactor element comprises a double dielectric barrier element having exhaust passages bounded by a dielectric barrier in the plasma direction.

18. The method of claim 17, wherein said reactor element comprises structural carrier dielectric connectors.

19. The method of claim 17, wherein said reactor element comprises structural conductor connectors.

20. The method of claim 15, wherein said reactor element comprises a single dielectric barrier element having exhaust passages bounded by a dielectric barrier on a first side and by an electrode on a second opposite side in the plasma direction.

21. The method of claim 20, wherein said reactor element comprises structural carrier dielectric connectors.

22. The method of claim 20, wherein said reactor element comprises:

a structural conductor connector; and a null dielectric barrier structural conductorconnector.

23. The method of claim 15, wherein said reactor element comprises a null dielectric barrier element comprising at least one pair of null dielectric barrier comb connectors, said combs having tines defined in a side to side configuration comprising a first electrode layer, a structural dielectric layer, and a second electrode layer;

said null dielectric barrier element having exhaust passages bounded by electrodes on each side, in the plasma direction.

24. The method of claim 23, wherein said reactor element comprises structural carrier connectors.

25. The method of claim 23, wherein said reactor element comprises structural conductor connectors.

* * * * *